United States Patent
Ng et al.

(10) Patent No.: US 7,725,043 B2
(45) Date of Patent: May 25, 2010

(54) SYSTEM AND METHOD FOR REDUCING INTERFEROMETRIC DISTORTION AND RELATIVE INTENSITY NOISE IN DIRECTLY MODULATED FIBER OPTIC LINKS

(75) Inventors: Willie W. Ng, Agoura Hills, CA (US); David L. Persechini, Santa Monica, CA (US); Robert H. Buckley, Canoga Park, CA (US)

(73) Assignee: Raytheon Company, Waltham, MA (US)

( * ) Notice: Subject to any disclaimer, the term of this patent is extended or adjusted under 35 U.S.C. 154(b) by 536 days.

(21) Appl. No.: 10/960,159

(22) Filed: Oct. 7, 2004

(65) Prior Publication Data
US 2006/0078339 A1   Apr. 13, 2006

(51) Int. Cl.
H04B 10/04 (2006.01)
H01S 3/00 (2006.01)

(52) U.S. Cl. .................... 398/194; 398/192; 398/195; 398/196; 398/25; 372/29.02; 372/29.011; 372/38.01; 372/38.02; 372/38.08; 372/20

(58) Field of Classification Search .................. 398/91, 398/192–201; 372/18–32
See application file for complete search history.

(56) References Cited

U.S. PATENT DOCUMENTS

| | | | | |
|---|---|---|---|---|
| 4,786,132 A * | 11/1988 | Gordon | ................. | 385/38 |
| 5,003,546 A * | 3/1991 | Lidgard et al. | ................. | 372/26 |
| 5,305,336 A * | 4/1994 | Adar et al. | ................. | 372/18 |
| 5,402,433 A * | 3/1995 | Stiscia | ................. | 372/31 |
| 5,717,708 A * | 2/1998 | Mells | ................. | 372/32 |
| 5,761,225 A * | 6/1998 | Fidric et al. | ................. | 372/6 |
| 5,850,303 A * | 12/1998 | Yamamoto et al. | ................. | 398/91 |
| 5,870,417 A * | 2/1999 | Verdiell et al. | ................. | 372/32 |
| 6,068,411 A * | 5/2000 | Ando | ................. | 385/88 |
| 6,278,721 B1 * | 8/2001 | Joyce | ................. | 372/102 |
| 6,580,734 B1 * | 6/2003 | Zimmermann | ................. | 372/29.02 |
| 6,839,377 B2 * | 1/2005 | Bacher | ................. | 372/102 |
| 6,862,136 B2 * | 3/2005 | Koren et al. | ................. | 359/344 |

(Continued)

FOREIGN PATENT DOCUMENTS

WO    WO 02/084828 A2 * 10/2002

OTHER PUBLICATIONS

Ball et al: "60 mW 1.5 um Single-Frequency Low-Noise Fiber Laser MOPA", IEEE Photonics Technology Letters, vol. 6, No. 2, Feb. 1994, p. 192-194).*

(Continued)

*Primary Examiner*—Li Liu

(57) ABSTRACT

A laser transmitter with a feedback control loop for minimizing noise. The novel laser transmitter includes a laser, an external reflector adapted to form an extended cavity to the laser, and a feedback control loop adapted to detect noise in the laser and in accordance therewith, adjust the optical phase of the extended cavity such that the noise is at a desired level. The optical phase of the extended cavity is adjusted by adjusting an operating parameter of the laser, such as its bias current. In an illustrative embodiment, the feedback control loop is adapted to compute the rate of change of the noise with respect to bias current and in accordance therewith, adjust the bias current of the laser such that relative intensity noise and interferometric intermodulation distortion are simultaneously minimized.

25 Claims, 5 Drawing Sheets

U.S. PATENT DOCUMENTS

| | | | | |
|---|---|---|---|---|
| 7,046,704 | B2* | 5/2006 | Fischer | 372/20 |
| 2004/0190570 | A1* | 9/2004 | Hubner | 372/32 |
| 2005/0123008 | A1* | 6/2005 | Daiber et al. | 372/20 |
| 2005/0180474 | A1* | 8/2005 | Buchold et al. | 372/38.08 |
| 2005/0220458 | A1* | 10/2005 | Kupershmidt et al. | 398/196 |

OTHER PUBLICATIONS

Ball et al: "60 mW 1.5 mm Single-Frequency Low-Noise Fiber Laser MOPA", IEEE Photonics Technology Letters, vol. 6, No. 2, Feb. 1994, p. 192-194.*

J. Zhang, C. Xie and K. Peng, "Electronic feedback control of the intensity noise of a single-frequency intracavity-doubled laser," J. Opt. Soc. Am. B/vol. 19, No. 8, August 2002.

J. Zhang, H. Chang, X. Jia, H. Lei, R. Want, C. Xie and K. Peng, "Suppression of the intensity noise of a laser-diode-pumped single-frequency ring Nd:YVO4-KTP green laser by optoelectronic feedback," Optics Letters, vol. 26, No. 10, May 15, 2001, pp. 695-697.

F. Rogister, D. Sukow, A. Gavrielides, P. Megret, O. Deparis and M. Blondel, "Experimental demonstration of suppression of low-frequency fluctuations and stabilization of an external-cavity laser diode," Optics Letters, vol. 25, No. 11, Jun. 1, 2000, pp. 808-810.

D.J. Ottaway, P.J. Veitch, C. Hollitt, D. Mudge, M.W. Hamilton and J. Munch, "Frequency and intensity noise of an injection-locked Nd:YAG ring laser," Appl. Phys. B 71, 2000, pp. 163-168.

M.Osinski and J. Buus, "Linewidth Broadening Factor in Semiconductor Lasers-An Overview," IEEE Journal of Quantum Electronics, vol. QE-23, No. 1, Jan. 1987, pp. 9-29.

G.P.Agrawal, N.A. Olsson and N.K. Dutta, "Effect of fiber-far-end reflections on intensity and phase noise in InGaAsP semiconductor lasers," Applied Phys. Lett. 45(6), 1984, p. 597-599.

G.P. Agrawal and N.K. Dutta, "Long-Wavelength Semiconductor Lasers," Van Nostrand Reinhold, 1986, p. 316.

* cited by examiner

Use Feedback Loop to Lock
Bias Current to this Corner

SYSTEM AND METHOD FOR REDUCING INTERFEROMETRIC DISTORTION AND RELATIVE INTENSITY NOISE IN DIRECTLY MODULATED FIBER OPTIC LINKS

BACKGROUND OF THE INVENTION

1. Field of the Invention

The present invention relates to optical systems. More specifically, the present invention relates to systems and methods for minimizing interferometric distortion and relative intensity noise in directly modulated fiber optic links.

2. Description of the Related Art

In a fiber optic transmission system, an RF (radio frequency) signal is often modulated onto an optical carrier and delivered subsequently to a remote site for additional processing via an optical link. During the modulation and transmission process, undesirable intermodulation products can be generated, corrupting the fidelity of the transmitted signal. In addition, relative intensity noise (RIN) generated by the transmitter further reduces the spur free dynamic range (SFDR) of the system. A maximal SFDR is desirable for many applications, such as the transmission of cable TV signals.

A viable method for reducing intermodulation distortion—in particular, those originating from interferometric effects—is to employ an externally modulated link, in which the output of a CW (continuous wave) laser is externally modulated using an electro-optic (EO) modulator. Many systems currently use this approach; however, it has several undesirable properties. In particular, the manner by which the EO modulator is designed requires a relatively expensive polarization maintaining fiber for coupling the output of the CW laser to the EO modulator. Secondly, the external modulator itself is fairly expensive, resulting in an impetus to replace it with a less costly solution.

An alternative approach is to use a directly modulated diode laser as the optical source. With this approach, the CW laser and the external modulator are replaced by a single component, a directly modulated diode laser. The RF input signal is transmitted by current modulation of the diode laser to the optical fiber. This is the desirable approach to replace the more expensive externally modulated link used in present systems. In addition to being potentially lower in cost, a directly modulated link is more compact and consumes less power.

Unfortunately, the directly modulated approach suffers from corruption of the transmission signal due to interferometric distortion. To mitigate this undesirable effect, an optical isolator is typically placed between the diode laser and its fiber pigtail. The use of an optical isolator, however, increases the complexity of the optics needed to efficiently couple the emission of the diode laser to the optical fiber. Furthermore, optical isolators are typically specified to operate over limited temperature ranges. In practice, the coupling efficiencies measured—with passage through these isolators—could also vary with temperature because of differences in the coefficients of thermal expansion between the laser mount, lens/isolator mount and fiber-anchor in the transmitter package. In addition, the diode laser generates relative intensity noise, which—although small in comparison to the signal—may affect applications where very high SFDR is required.

Hence, a need exists in the art for an improved system or method for minimizing interferometric intermodulation distortion and relative intensity noise in a directly modulated fiber optic link which is lower in cost and which can maintain a high efficiency over a wider temperature range than conventional approaches.

SUMMARY OF THE INVENTION

The need in the art is addressed by the laser transmitter of the present invention. The novel laser transmitter includes a laser, an external reflector adapted to form an extended cavity to the laser, and a feedback control loop adapted to detect noise in the laser and in accordance therewith, adjust the optical phase of the extended cavity such that the noise is at a desired level. The optical phase of the extended cavity is adjusted by adjusting an operating parameter of the laser, such as its bias current. In an illustrative embodiment, the feedback control loop is adapted to compute the rate of change of the noise with respect to bias current and in accordance therewith, adjust the bias current of the laser such that relative intensity noise and interferometric intermodulation distortion are simultaneously minimized.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
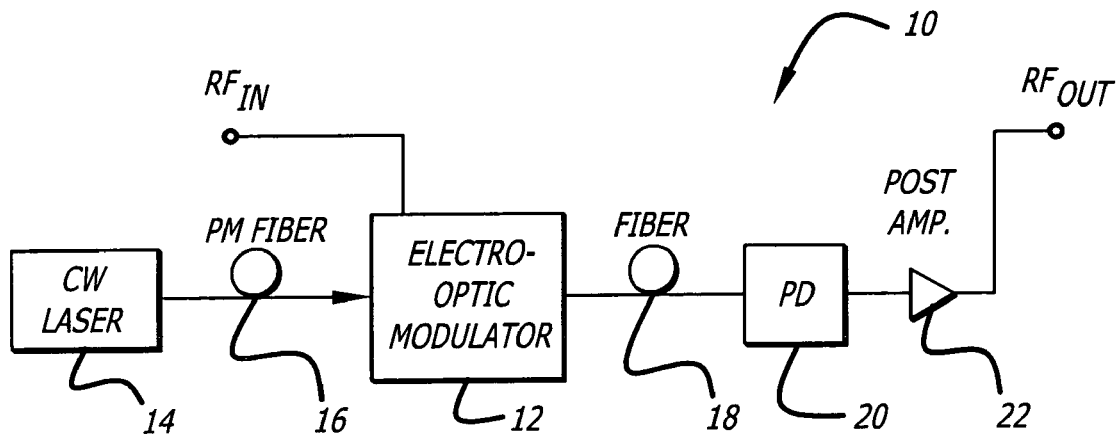
FIG. 1 is a simplified schematic of an externally modulated analog fiber optic link of conventional design and construction.

As mentioned above, the conventional method for reducing interferometric intermodulation distortion is to use an externally modulated link. FIG. 1 is a simplified schematic of an externally modulated analog fiber optic link 10 of conventional design and construction. In the transmission system 10 of FIG. 1, an input signal $RF_{IN}$ is modulated onto an optical carrier by an external electro-optic modulator 12. A CW laser 14 generates the optical carrier signal, which is delivered to the electro-optic modulator 12 by a polarization maintaining (PM) fiber 16. The modulated signal is then transmitted through optical fiber 18 until it is detected and converted to an RF signal by a photodetector 20 and amplified by a post amplifier 22, generating an output signal $RF_{OUT}$.

Many systems currently use this approach; however, it has several undesirable properties. In particular, because of the way the electro-optic modulator 12 is designed, the input end requires a relatively expensive polarization maintaining fiber 16. Second, the external modulator 12 itself is fairly expensive, so there is a need to replace it with a less costly solution. One approach is to use a directly modulated diode laser as the optical source.

Figure 2:
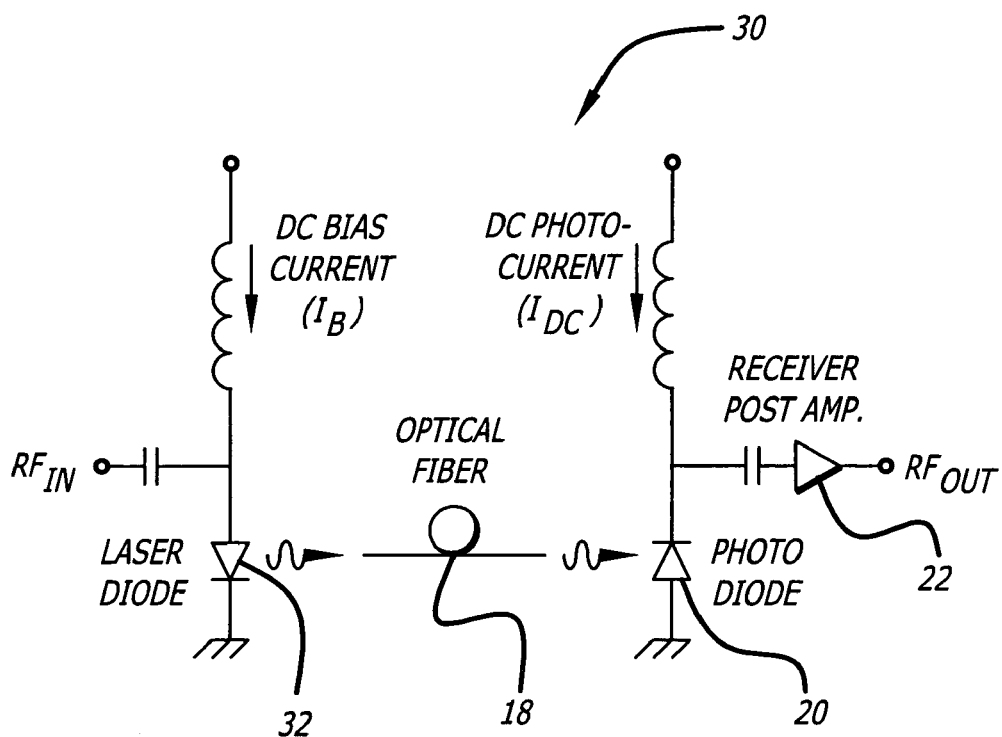
FIG. 2 is a simplified schematic of a directly modulated analog fiber optic link of conventional design and construction.

FIG. 2 is a simplified schematic of a directly modulated analog fiber optic link 30 of conventional design and construction. Here, the CW laser and the external modulator in the system of FIG. 1 are replaced by a single component, a directly modulated diode laser 32. The RF input signal is transmitted by current modulation of the diode laser 32 to the optical fiber 18. This is the preferred approach to replace the more expensive externally modulated link used in present systems.

In order to reduce interferometric distortion in a directly modulated link, an optical isolator is typically added between the diode laser 32 and the optical fiber 18. The use of an optical isolator, however, increases the complexity of the optics needed to efficiently couple the emission of the diode laser to the optical fiber. Furthermore, optical isolators are typically specified to operate over limited temperature ranges. Their figure of merit for isolation, defined as the ratio of the reflected power to incident power at the isolator's input plane, degrades substantially outside the specified temperature range of operation.

The present invention includes a laser transmitter having an external reflector and a novel feedback control system that simultaneously minimizes interferometric intermodulation distortion and relative intensity noise (RIN), and maintains their minimums over long periods of operation. Before discussing the details of the present invention, some technical background is first provided on (i) the origin of interferometric distortion, and (ii) the effects of an external reflector on interferometric distortion and the intensity noise of a diode laser.

Figure 3:
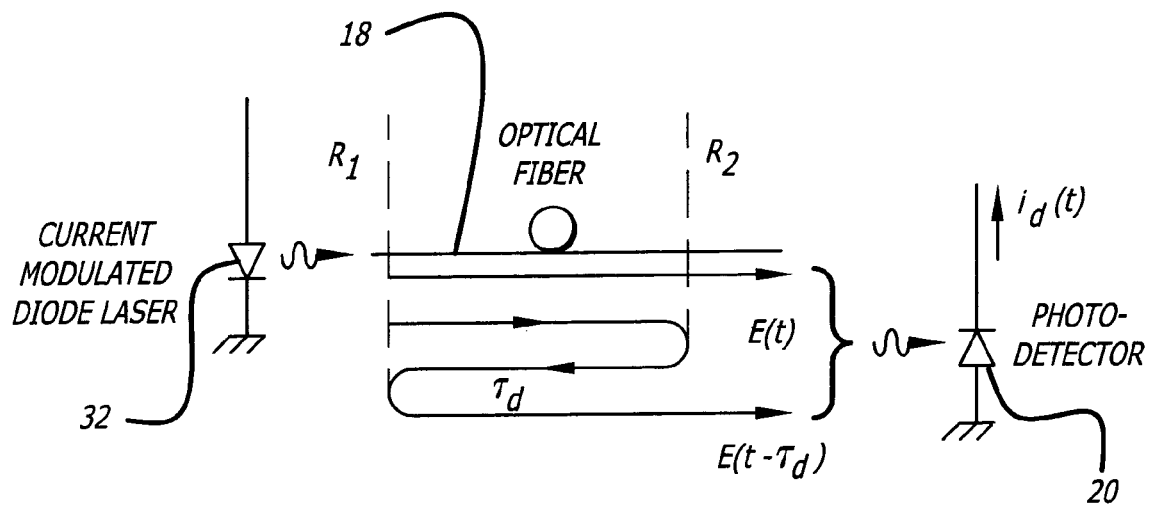
FIG. 3 is an illustration showing the generation of interferometric intermodulation distortion in a directly modulated analog fiber optic link.

FIG. 3 is an illustration showing the generation of interferometric intermodulation distortion in a directly modulated analog fiber optic link. Interferometric intermodulation distortion is generated when undesirable reflections cause the optical field E(t) emitted by the diode laser 32 to beat against a time-delayed version $E(t-\tau_d)$ of itself at the photodetector 20 (of the link's receiver). During this process, the photodetector 20 acts as a mixer that converts the phase-modulation $\theta(t)$ in the diode's optical output to amplitude noise, with associated third order distortions (IM3) for two-tone inputs.

In particular, the phase-modulation $\theta(t)$ stems from the chirping ($\Delta f$) of the lasing frequency in a diode laser, and is given by: $\theta(t)=\beta \cos(\omega_m t)$, where $\omega_m=2\pi f_m$ is the modulation frequency of the diode's drive current, and $\beta=\Delta f/f_m$ is the phase modulation index in the optical field E(t). This wavelength chirp ($\Delta\lambda$) and the accompanying phase modulation occur because a modulation of the gain in the diode's active medium—via current modulation—induces, at the same time, a significant fluctuation ($\Delta n_d$) in the real part ($n_d$) of its refractive index. This causes a self-induced modulation ($\Delta L_{opt}$) of the laser's optical cavity length, giving rise to the observed wavelength chirp. A parameter $\alpha$, known as the linewidth enhancement factor, has been adopted in the literature to quantify the aforementioned coupling between the real and imaginary part (corresponding to gain) of a semiconductor's refractive index. Specifically, $\alpha$ has a typical magnitude of about 1-3 for quantum well lasers. One can also estimate its magnitude with the equation: $\alpha=-2(\beta/m)$, where m is the amplitude modulation index in E(t).

By coupling the optical output of the diode laser to an external reflector, the chirp $\Delta\lambda$ of the lasing wavelength $\lambda_o$ can be significantly reduced, thereby achieving a reduction in the generation of interferometric IM3.

Figure 4:
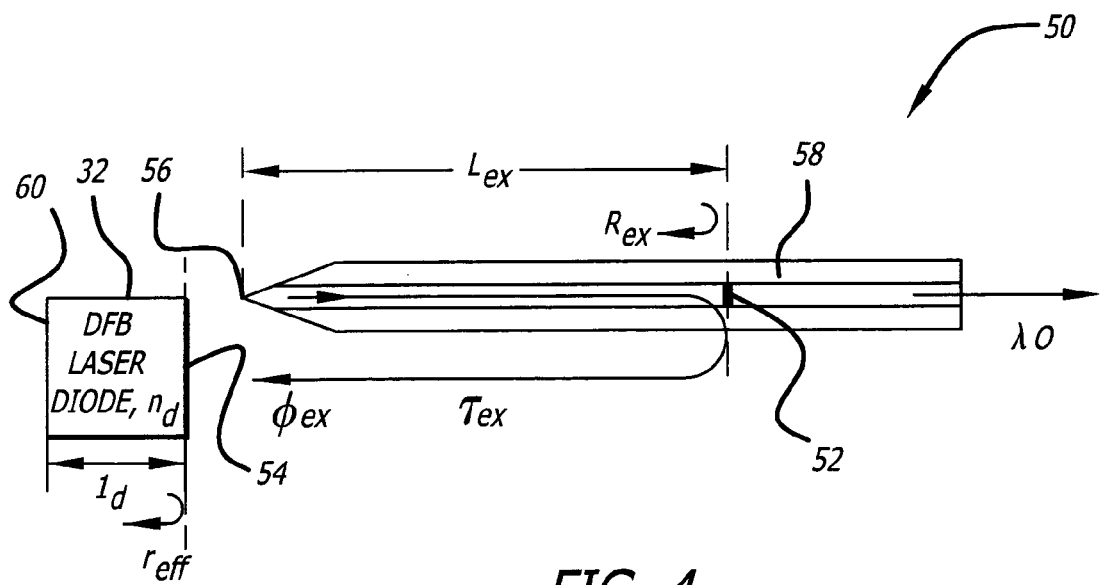
FIG. 4 is a diagram of a prior art low chirp laser transmitter having an external reflector.

FIG. 4 is a diagram of a prior art low chirp laser transmitter 50 having an external reflector 52. The laser transmitter 50 is formed by coupling the output of a diode laser 32 (of length $l_d$), via its AR (anti-reflective) coated front facet 54 (with reflectivity $R_{AR}$), to an external reflector 52. A fiber lens 56 couples the diode emission to a fiber pigtail 58 of refractive index $n_{ex}$. The external reflector 52, having reflectivity $R_{ex}$, is located within the fiber pigtail 58 at a distance $L_{ex}$ away from the front facet 54 of the diode laser 32. Some of the light traveling through the fiber pigtail 54 is thus reflected back towards the diode laser 32. This forms an extended cavity between the external reflector 52 and the back facet 60 of the laser diode 32.

The formation of an extended cavity reduces the modulation $\Delta L_{opt}$ of the laser's optical cavity length to a small fraction of the transmitter's overall optical cavity length ($L_{opt} \sim n_{ex} L_{ex}$). Specifically, the reduced wavelength chirp $\Delta\lambda$ is now given by:

$$\Delta\lambda = \lambda_o \frac{\Delta L_{opt}}{L_{opt}} = \lambda_o \frac{\Delta n_d}{n_d}\left(\frac{n_d l_d}{n_{ex} L_{ex}}\right) \qquad [1]$$

Hence, the wavelength chirp is reduced by the ratio of the diode's original optical cavity length to that of the extended-cavity laser. This reduces the generation of intermodulation distortion.

It is also well known that the magnitude of relative intensity noise in a diode laser is sensitive to the optical phase $\phi_{ex}$ of external feedback. If $\tau_{ex}$ is the round trip time of light in the external cavity (see FIG. 4) and QO its lasing frequency, the optical phase $\phi_{ex}$ is given by: $\phi_{ex}=\Omega_o \tau_{ex}$. In particular, the phase of the external feedback—relative to the internal reflection at the AR-coated coupling facet 54 of the diode 32—has a strong influence on the laser's RIN. Typically, $R_{AR}$ is about 1-2% for commercial distributed feedback (DFB) lasers. This small but finite reflectivity of the AR-coating changes—according to $\phi_{ex}$—the magnitude of the diode's RIN, making it larger or smaller than the intrinsic RIN of the diode laser. One can model the external feedback with an effective reflectivity $r_{eff}$ (with magnitude $|r_{eff}|$ and phase $\phi_{eff}$, see FIG. 4) given by:

$$r_{eff}=|r_{eff}|e^{j\phi_{eff}} \approx \sqrt{R_{AR}}+\sqrt{R_{ex}}e^{j\phi_{ex}} \qquad [2]$$

In effect, the light (in the diode 32) that comes from its coupling facet 54 has an optical phase $\phi_{eff}$ that varies periodically with $\phi_{ex}$. With external feedback to the diode, the oscillation frequency $\Omega_o$ of the overall laser is determined from the equation:

$$\phi_{eff} + \frac{2n_d l_d}{c} \cdot \Omega_o = 2m\pi \quad [3]$$

where m is an integer. Thus, one can fine tune the lasing frequency $\Omega_o$—for example, to minimize RIN—by changing (i) the original (solitary) diode lasing frequency $\omega_o$ (set by the second term of Eqn. 3), or (ii) the effective phase $\phi_{eff}$ of the feedback from the external reflector. ($\omega_o$ is the optical oscillation frequency of the diode laser 32 in the absence of external feedback.)

Figure 5:
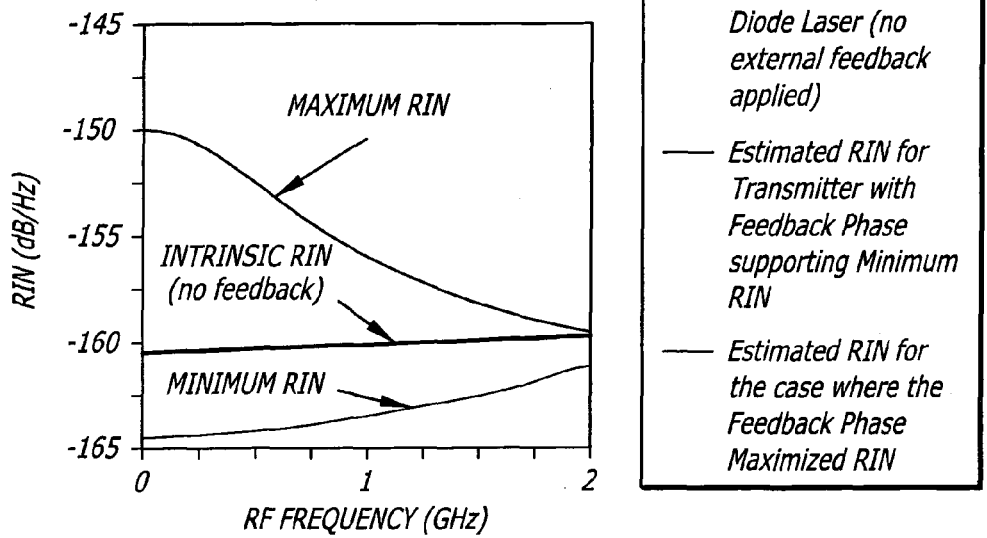
FIG. 5 is a graph showing RIN vs. frequency for the cases of $\phi_{ex}$ that give rise to maximal and minimal RIN in the diode laser, compared with the diode's intrinsic RIN.
Figure 6:
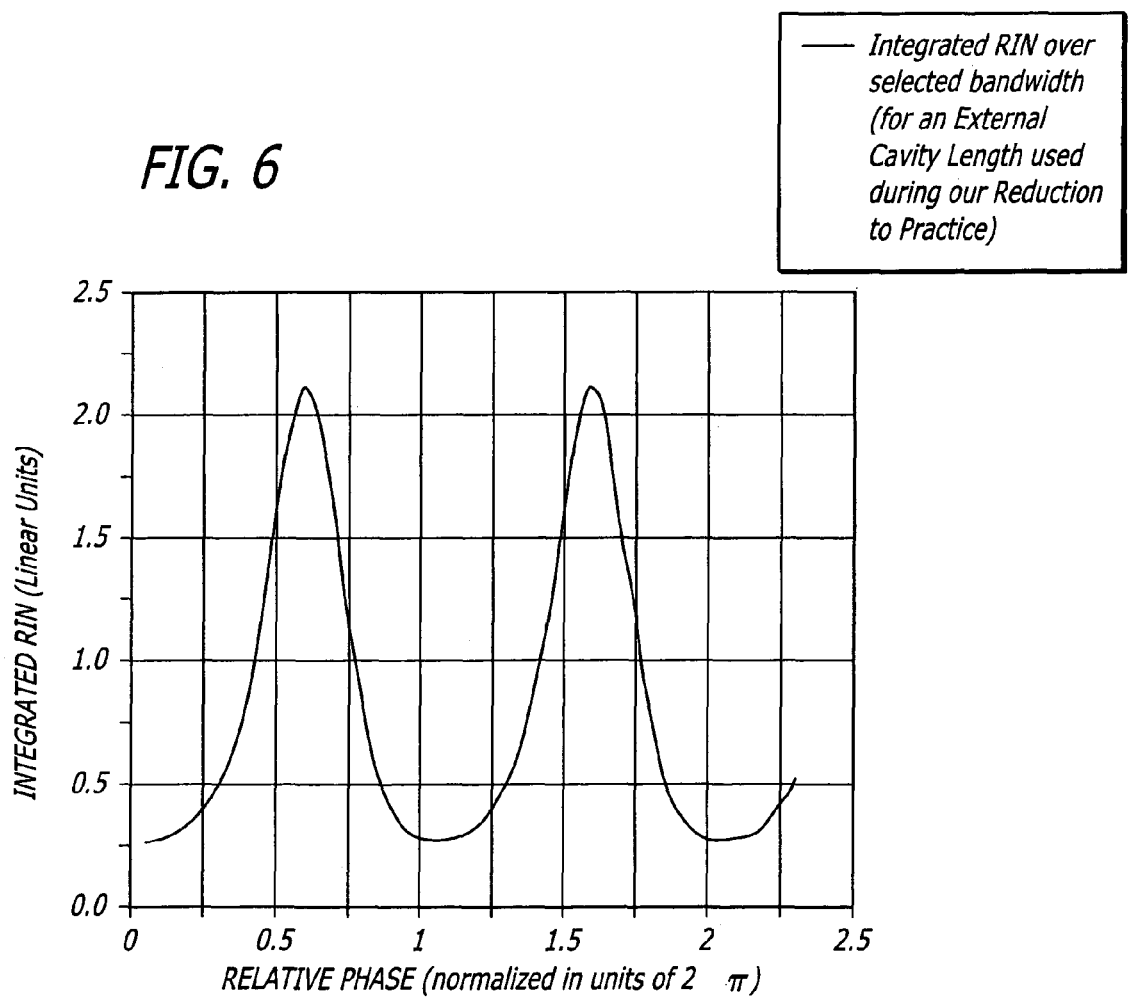
FIG. 6 is a graph of integrated RIN ($RIN_{int}$) as a function of the feedback phase $\phi_{ex}$.

To model the dynamic characteristics of a diode laser under external feedback, one needs to solve the Van der Pol equation for an extended cavity. Prior studies have solved this equation with the incorporation of Langevin noise sources, obtaining an expression for the transmitter's intensity noise spectrum as a function of $\tau_{ex}, \phi_{ex}, R_{AR}, R_{ex}$, the fiber coupling efficiency $\eta_c$, and the diode's output power, as well as other parameters intrinsic to the diode laser, such as its photon lifetime and the roundtrip time $\tau_d$ of light inside the diode. Based on the derived expression for the noise spectrum, the RIN was calculated (in dB/Hz) over a range of RF-frequencies $f_{RF}$. Specifically, the diode's intrinsic RIN was compared with the estimated RIN under external feedback, for different values of $\phi_{ex}$. FIG. 5 is a graph showing RIN vs. frequency for the cases of $\phi_{ex}$ that gave rise to maximal and minimal RIN in the diode laser, compared with the diode's intrinsic RIN. The RIN integrated over a selected frequency bandwidth was also computed. FIG. 6 is a graph of integrated RIN ($RIN_{int}$) as a function of the feedback phase $\phi_{ex}$. As shown, the RIN varies periodically (period=$2\pi$) with the feedback phase $\phi_{ex}$.

Thus, under optimal phases of external feedback, the diode will demonstrate lower intensity noise than a solitary laser source (i.e. one operating without external feedback). In the present invention, a novel approach is disclosed that enables one to lock the laser to the feedback condition that supports the minimum-RIN operation condition. This serves, in turn, to enhance the SFDR of the analog photonic link. As an additional benefit, it was experimentally shown that interferometric IM3 was also minimized under the optimal feedback phase $\phi_{ex}$ condition for minimal RIN. Thus, the feedback control approach of the present invention simultaneously minimizes RIN and interferometric intermodulation distortion in a directly modulated optical link.

In an illustrative embodiment, the laser diode's bias current (I) is used to optimize the feedback phase $\phi_{ex}$, thereby enabling the transmitter to operate at low RIN (and intermodulation distortion) over a long time span. In particular, a bias current feedback loop is used to control and lock the laser's performance parameters, so that its intensity noise and interferometric distortion are both actively minimized. The feedback control loop integrates the RIN of the diode laser over a targeted frequency bandwidth, and then computes the derivative D of this integrated RIN ($RIN_{int}$) with respect to the bias current I, i.e. $D=\delta(RIN_{int})/\delta I$, via the application of a very low frequency bias current dither. Using indicators derived from the polarity and magnitude of D, the bias current of the diode is then adjusted so that its intensity noise always sits at a minimum. With this new feedback approach for bias control, the third order intermodulation distortion (IM3) can be reduced by 45 dB (relative to its magnitude with the loop off).

Figure 7:
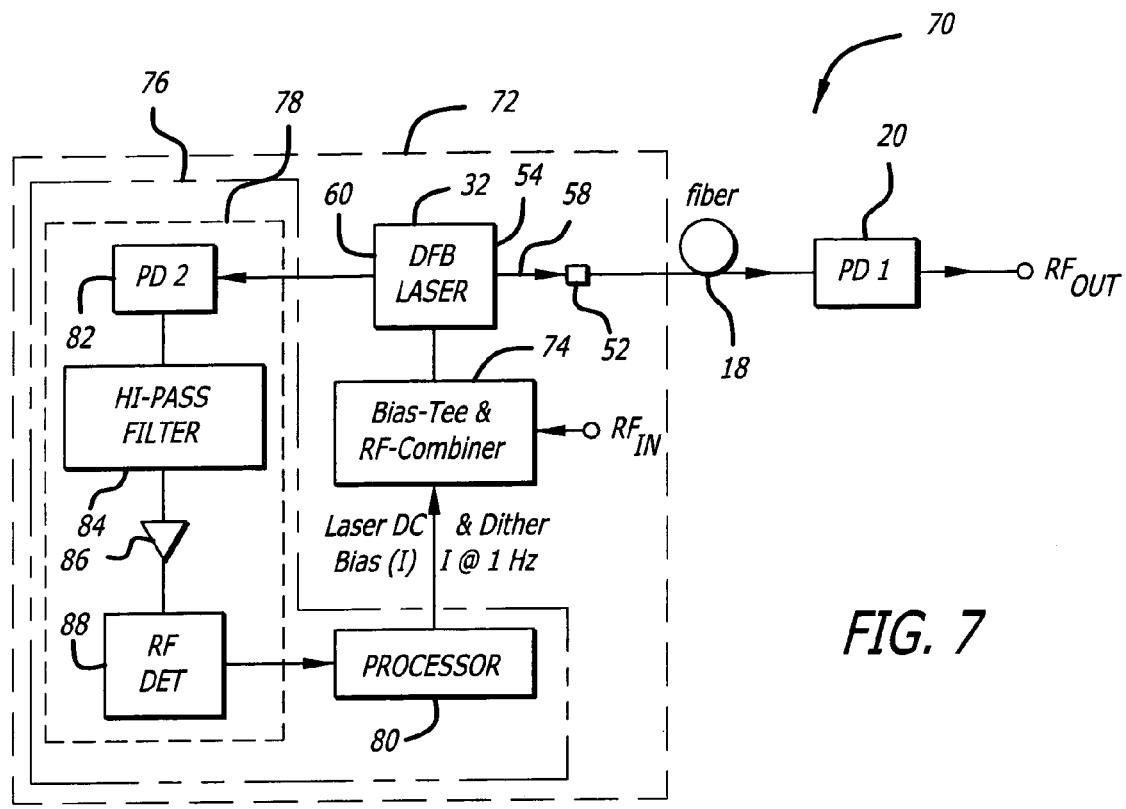
FIG. 7 is a simplified schematic of an illustrative embodiment of a directly modulated optical link having a feedback control loop designed in accordance with the teachings of the present invention.

FIG. 7 is a simplified schematic of an illustrative embodiment of a directly modulated optical link 70 having a feedback control loop designed in accordance with the teachings of the present invention. In the link 70, the signal output from a novel laser transmitter 72 is transmitted through optical fiber 18 to a first photodetector 20, which detects and converts the signal to RF, generating an output signal $RF_{OUT}$. The laser transmitter 72 includes a directly modulated diode laser 32 having a bias-tee and RF combiner 74 adapted to receive an input signal $RF_{IN}$ and a bias current I, and an external reflector 52 for forming an extended cavity to reduce chirp (as described above). The input signal $RF_{IN}$ is modulated onto an optical carrier by the diode laser 32 and output through the front facet 54 of the laser diode 32 towards the external reflector 52. In an illustrative embodiment, the external reflector 52 is integrated into the fiber pigtail 58 of the laser transmitter 72 by depositing a thin film (e.g. Si or $TiO_2$) on the cleaved surface of a short piece of fiber, which is then spliced to a longer fiber length to form a fiber pigtail 58. Other methods for generating reflectivity, however, may be used to form the extended cavity without departing from the scope of the present teachings.

In accordance with the teachings of the present invention, the laser transmitter 72 also includes a novel feedback control loop 76 adapted to control the bias current I of the diode laser 32, such that RIN and interferometric IM3 are minimized. The feedback control loop 76 includes a circuit 78 for detecting and measuring noise in the diode laser 32, and a processor 80 adapted to receive the noise measurements from the noise measuring circuit 78 and in accordance therewith, adjust the bias current I such that RIN is minimized.

In the illustrative embodiment of FIG. 7, the noise measuring circuit 78 includes a second photodetector 82 adapted to receive energy output from the back facet 60 of the diode laser source 32 (a small amount of light generated by the diode laser 32 is allowed to exit through the back facet 60). The second photodetector 82 is used to measure the level of RIN in the diode 32. In order to measure the RIN accurately, a high-pass RF filter 84 is used to reject the stronger photodetected signals located at the input RF frequencies. An RF amplifier 86 then amplifies the signal output from the high-pass filter 84. After RF-amplification, the signal is fed to an RF detector 88 that effectively integrates the RIN over a selected frequency bandwidth, allowing the RIN to be more easily detected. The output ($RIN_{int}$ in Volts) of the RF detector 88 is then fed to the processor 80.

In the illustrative embodiment of FIG. 7, the processor 80 is adapted to compute the derivative $D=\delta(RIN_{int})/\delta I$, which is a measure of how the RIN changes with respect to bias current I. In order to sense an increase or decrease of RIN with respect to the bias current I, the processor 80 applies a low frequency (for example, about 1 Hz) current dither ($\delta I$) to the bias current I of the laser 32. The processor 80 can then estimate the derivative D from the measurements of $RIN_{int}$ output from the noise measuring circuit 78 (by dividing the change in measured $RIN_{int}$ by the change in applied bias current I). As an example, if a bias current of $I_1$=40.0 mA is applied at time $T_1$ and results in a noise measurement of $RIN_{int1}$=20 mV, and if the bias current is increased (because of the current dither) to $I_2$=40.002 mA at time $T_2$ and results in a noise measurement of $RIN_{int2}$=25 mV, then the derivative is calculated to be $D=(RIN_{int2}-RIN_{int1})/(I_2-I_1)$=+2500 mV/mA. Based on the polarity and magnitude of D, the processor 80 then adjusts the bias current I of the diode laser 32 so that $RIN_{int}$ always sits at a minimum. When the $RIN_{int}$ is at a minimum, the derivative D will be approximately zero. If the derivative D is positive, then the bias current I should be decreased. If the derivative D is negative, then the bias current I should be increased. The laser transmitter 72 is thus locked to the minimum RIN.

Figure 8:
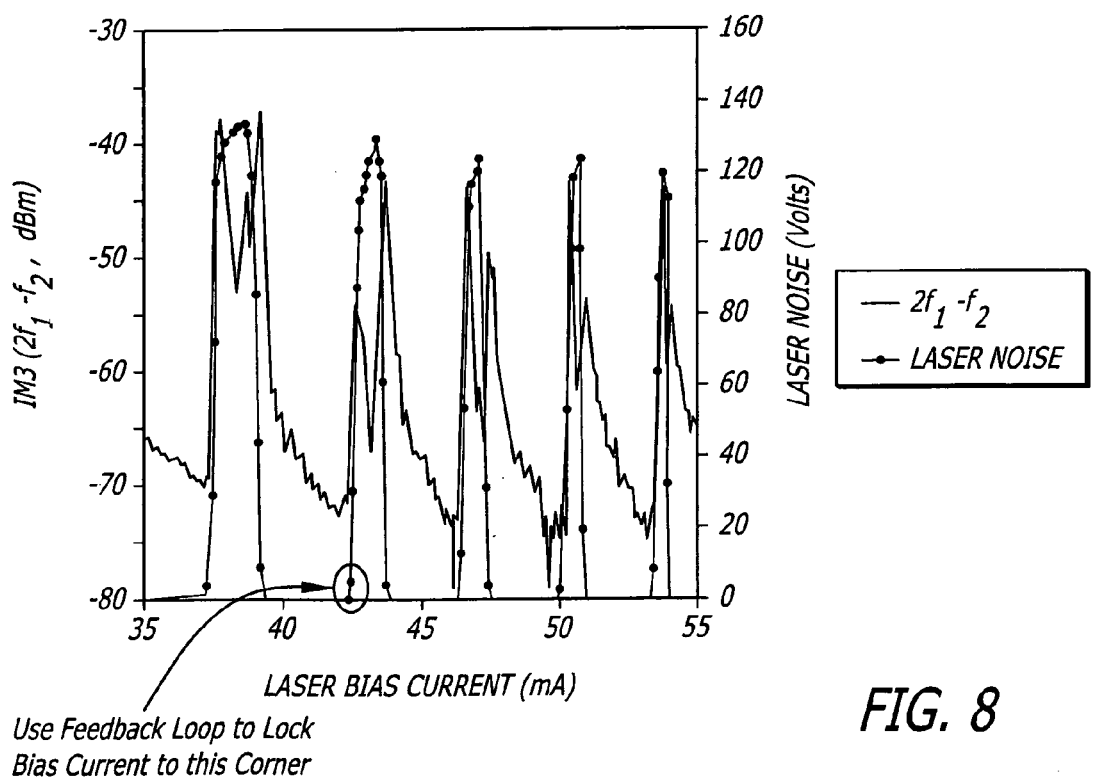
FIG. 8 is a graph of experimental data for $RIN_{int}$ vs. the laser bias current I.

FIG. 8 is a graph of experimental data for the noise $RIN_{int}$ vs. the laser bias current I. As shown, the measured minimum for $RIN_{int}$ repeats itself, with a period of $I_{period}$~4 to 4.5 mA, with respect to the bias current of the diode.

The physical principle underlying the operation of the novel feedback control loop 76 can be briefly described as follows. Under external feedback, the extended-cavity laser oscillates at a frequency $\Omega_o = 2\pi c/\lambda_o$ that is dictated by Eqn. 3. When the bias current I of the laser is adjusted adiabatically by the feedback control loop 76, it incurs, via thermal effects, a small change in the original (solitary) lasing frequency $\omega_o$ of the diode 32. This thermal tuning rate is approximately ~1 Å/° C. (or 17.75 GHz/° C. at $\lambda_o$~1300 nm) for DFB diode lasers. Using a typical thermal impedance of 60° C./watt for these diode lasers, a bias current increase of 2.09 mA (from $I_o$~40 mA) will induce a temperature change of ~0.144° C. in the diode. This causes, in turn, a tiny shift in the solitary diode oscillation frequency $\omega_o$ by 2.54 GHz (in optical frequency), i.e. by ~0.143 Å in optical wavelength. However, this small shift is sufficient to tune the lasing frequency $\omega_o$ over half of an external-cavity mode-spacing ($\Delta f_{ex}$), where $\Delta f_{ex}$ is given by $1/\tau_{ex}$ ($\Delta f_{ex}$ was ~5.07 GHz in an illustrative embodiment). With this tuning of $\omega_o$ over $\Delta f_{ex}/2$, the external feedback phase $\phi_{ex}$ will change by $\pi$ (for the same round-trip time $\tau_{ex}$). As illustrated in the plot shown in FIG. 6, one can tune the laser from a condition of maximal RIN to one corresponding to minimal RIN via a $\pi$ phase-shift in $\phi_{ex}$.

Figure 9:
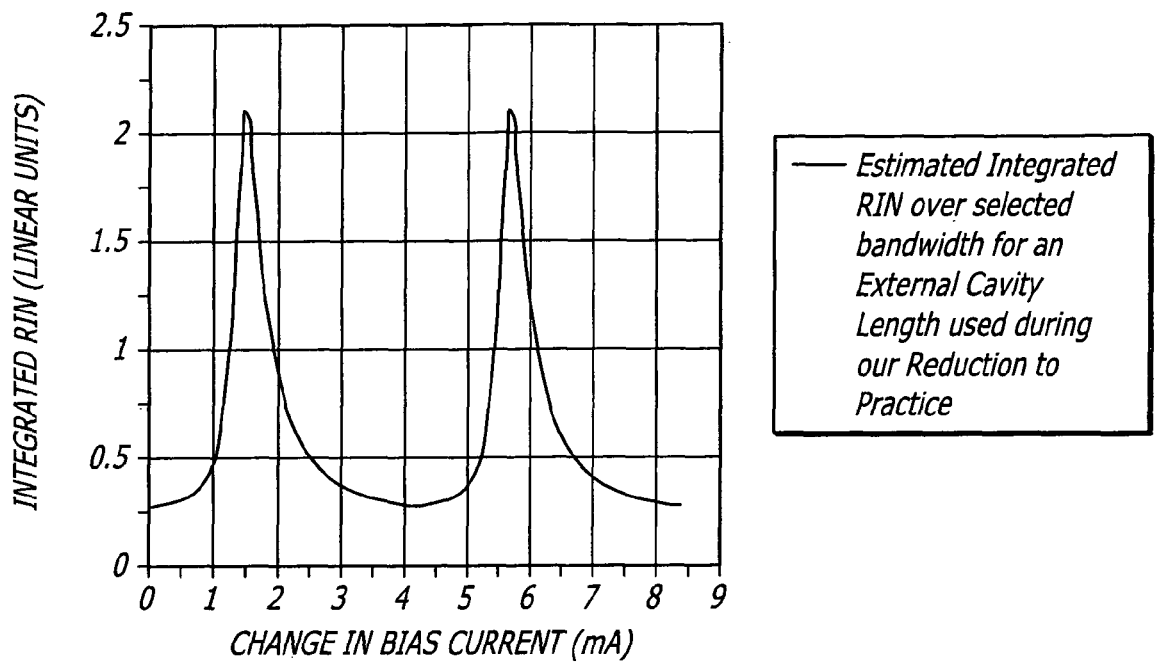
FIG. 9 is a graph of the modeled periodic variation of the integrated RIN ($RIN_{int}$) with respect to changes in the bias current $\Delta I$.

FIG. 9 is a graph of the modeled periodic variation of the integrated RIN ($RIN_{int}$) with respect to changes in the bias current $\Delta I$, using the thermal parameters mentioned above. This periodic variation of $RIN_{int}$ with I (period ~4.2 mA in simulation) forms the basis for the bias adjustments performed by the feedback control loop 76 of the present invention.

The graph of FIG. 8 also shows a plot of the measured IM3 vs. bias current I when two RF tones (at frequencies $f_1$ and $f_2$) were used to modulate the laser diode 32. As shown in that figure, the minimum of the intermodulation distortion IM3 is co-located with the left minimum of the $RIN_{int}$. Thus, by locking $RIN_{int}$ to a minimum as described above, the important benefit of minimizing the IM3 of a directly modulated link is also simultaneously achieved.

Figure 10:
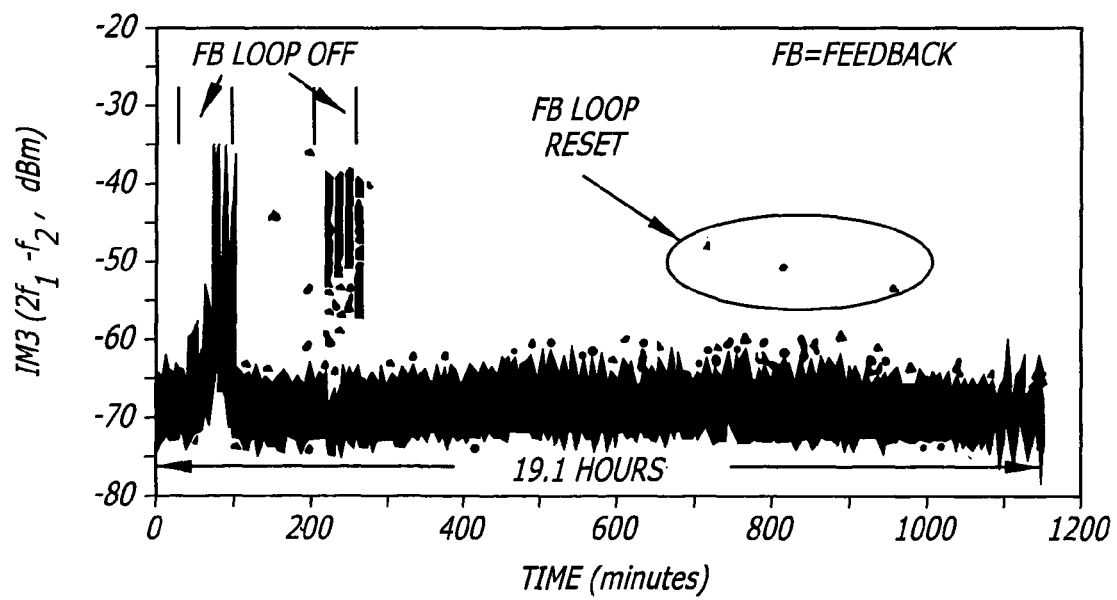
FIG. 10 is a graph showing the measured IM3 vs. time in a simulation using a feedback control loop designed in accordance with the teachings of the present invention.

FIG. 10 is a graph showing the measured IM3 vs. time in a simulation using the feedback control loop 76 to lock the laser 72 to a minimum level of IM3, over an arbitrarily chosen operation period of ~19.1 hours. Notice that the measured IM3, with the loop closed, was 25-30 dB below its level measured with the loop opened.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A system for controlling noise in a laser source comprising:
    first means for providing external feedback to said laser source such that noise in a laser output generated by said laser source varies depending on a bias current of said laser source, wherein said bias current is a current applied to a laser diode of said laser source to produce said laser output, and
    second means for adjusting said bias current such that said noise is at a desired level, wherein said second means includes a noise measuring circuit adapted to detect noise in said laser output and in accordance therewith generate noise measurements, and wherein said noise measuring circuit includes means for detecting said laser output and converting it to an electrical signal and means for rejecting signals in said electrical signal that are located at frequencies of said input signal and means for amplifying said electrical signal and means for integrating said electrical signal over a selected frequency bandwidth to generate said noise measurements.

2. The invention of claim 1 wherein said noise includes relative intensity noise.

3. The invention of claim 1 wherein said laser source is a directly modulated diode laser adapted to receive an input signal and a bias current, and in accordance therewith, generate said laser output.

4. The invention of claim 1 wherein said second means further includes third means for receiving said noise measurements and in accordance therewith, adjusting said bias current.

5. The invention of claim 4 wherein said third means includes a processor.

6. The invention of claim 5 wherein said processor is adapted to adjust said bias current such that said noise is minimized.

7. The invention of claim 5 wherein said processor is adapted to adjust said bias current such that interferometric intermodulation distortion is minimized.

8. The invention of claim 5 wherein said processor is adapted to compute the rate of change of the noise with respect to the bias current.

9. The invention of claim 8 wherein said processor is adapted to apply a low frequency current dither to said bias current.

10. The invention of claim 9 wherein said rate of change is computed by dividing the change in noise measurements by the change in bias current over a period of time.

11. The invention of claim 8 wherein said processor is adapted to adjust said bias current in accordance with the polarity and magnitude of said rate of change.

12. The invention of claim 1 wherein said first means includes an external reflector positioned to form an extended cavity to said laser source and adapted to reflect some of said laser output back towards said laser source.

13. The invention of claim 12 wherein said laser source includes a front facet and a back facet.

14. The invention of claim 13 wherein said laser output is coupled to said external reflector through said front facet.

15. The invention of claim 14 wherein said laser output is coupled to said noise measuring circuit through said back facet.

16. The invention of claim 1 wherein said laser source is a distributed feedback laser.

17. The invention of claim 1 wherein said noise varies periodically with said bias current.

18. A laser transmitter comprising:
    a directly modulated diode laser adapted to receive an input signal and a bias current, and in accordance therewith, generate a laser output, wherein said bias current is a current applied to a laser diode to produce said laser output;
    an external reflector positioned to form an extended cavity external to said laser and adapted to receive said laser output and return an external feedback signal to said laser; and a feedback control loop adapted to detect noise in said laser output and in accordance therewith, adjust said bias current such that said noise is at a desired level, wherein said feedback control loop includes a noise measuring circuit adapted to detect noise in said laser output and in accordance therewith generate noise measurements, and wherein said noise measuring circuit includes a detector adapted to detect said laser output and convert it to an electrical signal and a high pass filter adapted to receive said electrical signal and reject signals located at frequencies of said input signal and an amplifier adapted to amplify a signal output from said high pass filter and an RF detector adapted to integrate said electrical signal output from said amplifier over a selected frequency bandwidth to generate said noise measurements.

19. The invention of claim 18 wherein said feedback control loop further includes a processor adapted to receive said noise measurements and in accordance therewith, adjust said bias current such that said noise is at a desired level.

20. The invention of claim 19 wherein said processor is adapted to adjust said bias current such that said noise is minimized.

21. The invention of claim 20 wherein said processor is adapted to adjust said bias current such that interferometric intermodulation distortion is also minimized.

22. The invention of claim 19 wherein said processor is adapted to compute the rate of change of the noise with respect to the bias current.

23. The invention of claim 22 wherein said processor is adapted to apply a low frequency current dither to said bias current.

24. A directly modulated optical link comprising:
a laser transmitter including:
a directly modulated diode laser adapted to receive an input signal and a bias current, and in accordance therewith generate a laser output, wherein said bias current is a current applied to a laser diode to produce said laser output;
an external reflector positioned to form an extended cavity external to said laser and adapted to receive said laser output and return an external feedback signal to said laser; and
a feedback control loop adapted to detect noise in said laser output and in accordance therewith, adjust said bias current such that said noise is at a desired level wherein said feedback control loop includes a noise measuring circuit adapted to detect noise in said laser output and in accordance therewith generate noise measurements, and wherein said noise measuring circuit includes a detector adapted to detect said laser output and convert it to an electrical signal and a high pass filter adapted to receive said electrical signal and reject signals located at frequencies of said input signal and an amplifier adapted to amplify a signal output from said high pass filter and a circuit adapted to integrate said electrical signal over a selected frequency bandwidth to generate said noise measurements;
a photodetector for receiving said laser output; and
an optical fiber for transmitting said laser output from said laser transmitter to said photodetector.

25. A method for minimizing interferometric intermodulation distortion and relative intensity noise in a directly modulated fiber optic link including the steps of:
generating a laser output using a laser powered by a bias current, wherein said bias current is a current applied to a laser diode to produce said laser output;
forming an extended cavity external to said laser and adapted to receive said laser output and return an external feedback signal to said laser such that noise in said laser output varies depending on said bias current;
providing a noise measuring circuit adapted to detect noise in said laser output and in accordance therewith generate noise measurements, wherein said noise measuring circuit includes a detector adapted to detect said laser output and convert it to an electrical signal and a high pass filter adapted to receive said electrical signal and reject signals located at frequencies of said input signal and an amplifier adapted to amplify a signal output from said high pass filter and a circuit adapted to integrate said electrical signal over a selected frequency bandwidth to generate said noise measurements;
measuring noise in said laser output using said noise measuring circuit; and
adjusting said bias current such that said noise is at a desired level.

* * * * *